US008624241B2

(12) United States Patent
Oh

(10) Patent No.: US 8,624,241 B2
(45) Date of Patent: Jan. 7, 2014

(54) SEMICONDUCTOR CHIP, STACK-TYPE SEMICONDUCTOR PACKAGE

(75) Inventor: Tac Keun Oh, Seongnam-si (KR)

(73) Assignee: SK Hynix Inc., Gyeonggi-do (KR)

( * ) Notice: Subject to any disclaimer, the term of this patent is extended or adjusted under 35 U.S.C. 154(b) by 64 days.

(21) Appl. No.: 13/307,197

(22) Filed: Nov. 30, 2011

(65) Prior Publication Data

US 2012/0138925 A1    Jun. 7, 2012

(30) Foreign Application Priority Data

Dec. 1, 2010    (KR) .................. 10-2010-0121243
Nov. 23, 2011    (KR) .................. 10-2011-0123016

(51) Int. Cl.
*H01L 23/58*    (2006.01)

(52) U.S. Cl.
USPC ............. 257/48; 257/684; 257/686; 257/724; 257/E23.011; 438/14

(58) Field of Classification Search
USPC .................. 257/621, 686, 690, 697, 700, 777; 438/118, 618–624, 106–108, 594–598, 438/637–638, 672–673
See application file for complete search history.

(56) References Cited

U.S. PATENT DOCUMENTS

| | | | |
|---|---|---|---|
| 6,239,495 B1 * | 5/2001 | Sakui et al. | 257/777 |
| 6,809,421 B1 * | 10/2004 | Hayasaka et al. | 257/777 |
| 7,355,273 B2 * | 4/2008 | Jackson et al. | 257/686 |
| 7,598,532 B2 * | 10/2009 | Fujita et al. | 257/98 |
| 8,115,297 B2 * | 2/2012 | Yang | 257/692 |
| 8,344,516 B2 * | 1/2013 | Chainer | 257/774 |
| 2002/0125566 A1 * | 9/2002 | Tonami et al. | 257/728 |
| 2011/0093224 A1 * | 4/2011 | Ide et al. | 702/64 |

\* cited by examiner

*Primary Examiner* — Dung A. Le

(74) *Attorney, Agent, or Firm* — William Park & Associates Patent Ltd.

(57) ABSTRACT

A semiconductor chip includes: a first substrate having a first surface and a second surface facing away from the first surface; a first test through silicon via (TSV) passing through the first substrate from the first surface to the second surface; and a conductive protrusion coupled to the first test TSV and protruding from the second surface.

14 Claims, 13 Drawing Sheets

2

SEMICONDUCTOR CHIP, STACK-TYPE SEMICONDUCTOR PACKAGE

CROSS-REFERENCES TO RELATED APPLICATIONS

The present application claims priority under 35 U.S.C 119(a) to Korean Application Nos. 10-2010-0121243 and 10-2011-0123016, filed on Dec. 1, 2010 and Nov. 23, 2011, in the Korean intellectual property Office, which is incorporated herein by reference in its entirety.

BACKGROUND

Exemplary embodiments of the present invention relate generally to a semiconductor package and a method for manufacturing the same, and more particularly, to a semiconductor chip having a conductive protrusion formed therein to facilitate a test of a package, a semiconductor package using the same, and a method for manufacturing the same.

With broadening uses of miniaturized and high-performance electronic products such as mobile products, the efforts for miniaturized, high-capacity semiconductor memory devices continue. To improve the memory capacity, a plurality of semiconductor chips may be mounted and assembled in a single package. Packaging is generally considered to be more effective and less costly to increase storage capacity as compared to improving the degree of high integration in the semiconductor chip. Therefore, a variety of attempts to increase the storage capacity of a semiconductor memory device through a multi-chip package having a plurality of semiconductor chips therein are being made.

The multi-chip package may have a vertical configuration or a horizontal configuration. The vertical configuration comprises a plurality of semiconductor chips stacked vertically, and the through-silicon via (TSV) is one of the key technologies for this type of multi-chip package with high density and high performance. The package employing TSVs has a configuration that a plurality of semiconductor chips are coupled in a vertical direction through TSVs which are formed in the respective semiconductor chips at a wafer level.

A system in package (hereafter, referred to as SIP) is known as a package in which the same kind or various kinds of semiconductor devices are vertically stacked at a chip level or wafer level and the stacked wafers or chips are coupled to each other through TSVs. In such an SIP, the data storage density may be increased by stacking vertically the same kind of chips. Furthermore, various types of package may be manufactured by stacking various types of chips.

On the other hands, before the memory chips are stacked over the substrate, the performance of the memory chip needs to be tested. A memory chip includes a large number of bumps formed in a lower portion thereof, but the size and pitch of the bumps are very small. Therefore, a probe test is difficult to be performed.

SUMMARY

An embodiment of the present invention relates to a semiconductor chip which is capable of testing whether a circuit layer normally operates or not and whether a circuit layer is electrically coupled or not, for each single package product, while realizing a fine pitch, and a method for manufacturing the same.

In an embodiment, a semiconductor chip includes: a first substrate having one surface and the other surface facing the one surface; a first test TSV passing through the first substrate from the one surface to the other surface; and a conductive protrusion electrically coupled to the first test TSV and protruding from the other surface.

The conductive protrusion may be positioned at an edge of the substrate, which deviates from the center of the first test TSV.

The semiconductor chip may further include a land portion coupling the conductive protrusion and the first test TSV. The land portion may be coupled to the first test TSV through a rearrangement interconnection.

In an embodiment, a semiconductor package includes: a substrate; two or more semiconductor chips stacked over the substrate and each having one surface and the other surface facing the one surface and comprising a test TSV passing through the semiconductor chip from the one surface to the other surface; and a conductive protrusion protruding from the other surface of the uppermost semiconductor chip among the semiconductor chips and electrically coupled to the test TSV.

The conductive protrusion may be positioned at an edge of the substrate, which deviates from the center of the test TSV.

The semiconductor package may further include a land portion formed on the other surface of the uppermost semiconductor chip and coupling the conductive protrusion and the test TSV.

The land portion may be coupled to the test TSV through a rearrangement interconnection.

The semiconductor package may further include a controller between the substrate and the semiconductor chip.

In an embodiment, a method for manufacturing a semiconductor package includes: stacking a first semiconductor chip over a second semiconductor chip, the first semiconductor chip having one surface and the other surface facing the one surface and comprising a first test TSV passing through the first semiconductor chip from the one surface to the other surface; forming an insulation layer on the other surface of the first semiconductor chip, and patterning the insulation layer to expose the first test TSV; and forming a conductive protrusion which is electrically coupled to the exposed first test TSV and protrudes from the other surface.

The method may further include forming a land portion electrically coupling the exposed first test TSV and the conductive protrusion, before the forming of the conductive protrusion.

The conductive protrusion may be positioned at an edge of the first semiconductor chip, which deviates from the center of the first test TSV.

The forming of the conductive protrusion may include: positioning a mask over the first semiconductor chip; mounting a solder ball in an open portion of the mask; and performing a reflow process such that the solder ball is fused to the first test TSV.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
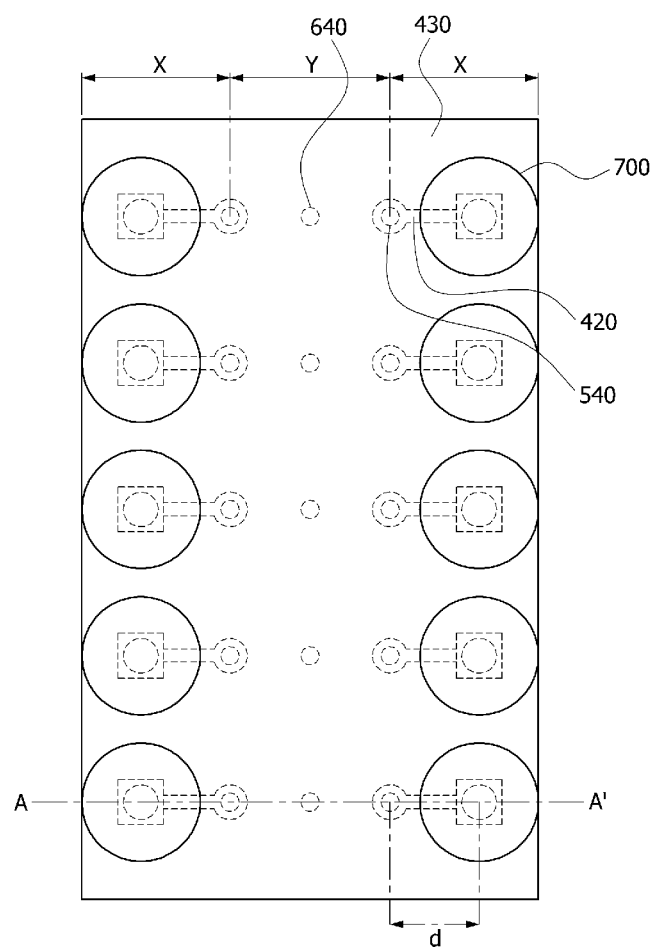
FIGS. 1 and 2 are plan and cross-sectional views illustrating a partial structure of a semiconductor chip in accordance with an embodiment of the present invention.
Figure 2:
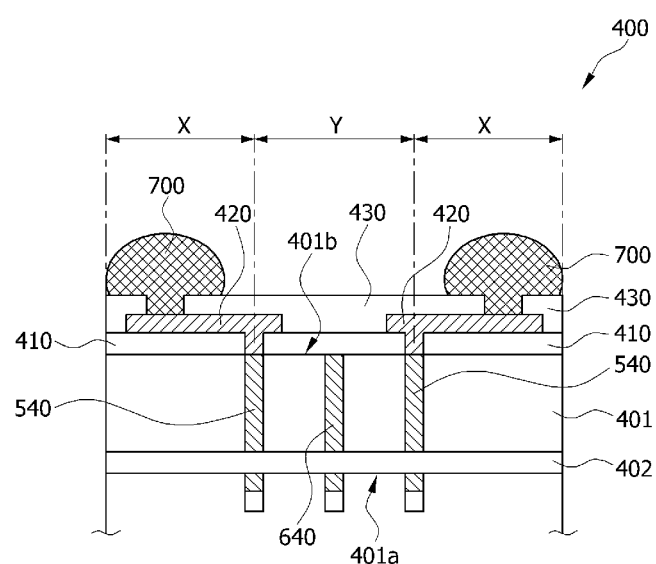

FIGS. 1 and 2 are plan and cross-sectional views illustrating a partial structure of a semiconductor chip in accordance with an embodiment of the present invention. FIG. 2 illustrates a cross-section taken along a line A-A' of FIG. 1.

Referring to FIGS. 1 and 2, a semiconductor chip 400 in accordance with an embodiment of the present invention includes a first substrate 401, a first test TSV 540, and a conductive protrusion 700.

The first substrate 401 has a first surface 401a and a second surface 401b facing away from the first surface 401a. The first surface 401a includes an active region 402 where a semiconductor device such as a transistor is formed. Furthermore, the first substrate 401 may include an interconnection layer (not illustrated) which electrically couples the semiconductor device to another device or functional unit.

The first test TSV 540 is formed through the first substrate 401 from the first surface 401a to the second surface 401b. The first substrate 401 may include a plurality of test TSVs formed therein, but the test TSVs are collectively referred to as the first test TSV 540. The first test TSV 540 may be coupled to a circuit layer (not illustrated) inside the first substrate 401 so as to test whether the circuit normally operates or not. The circuit layer may include an interconnection layer for applying an electrical signal to a semiconductor device such as the semiconductor device formed in the active region 402 of the first substrate 401.

The conductive protrusion 700 is electrically coupled to the first test TSV 540, and the shape or material thereof is not limited. For example, the conductive protrusion 700 may be formed in various shapes, such as hemisphere, sphere, and hexagonal pillar, as well as a mushroom shape as illustrated in FIG. 2, and this will be described below in more detail. Since the conductive protrusion 700 becomes an electrical path, the conductive protrusion 700 may include a conductive material such as conductive polymer, derivatives thereof, a metal, or a composite of conductive polymer and metal. For example, the conductive protrusion 700 may include one or more selected from the group consisting of conductive polymers and derivatives thereof, such as olyaniline, polythiophene, poly (3,4-ethylene dioxythiophene), polypyrrole and PPV (polyphenylenevinylene). Furthermore, the conductive protrusion 710 may include one or more metals selected from the group consisting of gold (Au), silver (Ag), copper (Cu), aluminum (Al), nickel (Ni), tungsten (W), titanium (Ti), platinum (Pt), palladium(Pd), tin (Sn), plumbum (Pb), zinc (Zn), indium (In), cadmium (Cd), chrome (Cr), and molybdenum (Mo).

A land portion 420 serves to electrically couple the conductive protrusion 700 and the first test TSV 540. The land portion 420 may be coupled to the first test TSV 540 through a rearrangement interconnection (not illustrated). Since the land portion 420 becomes an electrical coupling path between the first test TSV 540 and the conductive protrusion 700, the land portion 420 may include a conductive material such as conductive polymer, a derivative thereof, metal, or a composite of conductive polymer and metal. Here, the land portion 420 may include one or more metals selected from the group consisting of Au, Ag, Cu, Al, Ni, W, Ti, Pt, Pd, Sn, Pb, Zn, In, Cd, Cr, and Mo, and may have a multilayer structure. When the conductive protrusion 700 is directly coupled to the first test TSV 540, the land portion 420 may be omitted.

Between the first substrate 401 and the conductive protrusion 700, a first insulation layer 410 and a second insulation layer 430 may be interposed. The first and second insulation layers 410 and 430 may include one or more of an organic insulating material and an inorganic insulating material. Any materials may be used as long as they perform an insulation function. Examples of the organic insulating material may include polyimide, benzocyclobutene, photoacryl, polyester, photosensitive resin including photoresist, SiOCH, SiCHN, and SiCH, and examples of the inorganic insulating material may include silicon oxide, silicon nitride, silicon carbide, metal oxide, SiC, and SiCN. However, the present invention is not limited thereto.

The photoresist may include a sensitizer showing a sensitive reaction to light, resin becoming a body of a thin film, and an organic solvent for dissolving resin, and both of positive photoresist and negative photoresist may be used. In the case of the positive photoresist, novolak, resole, and phenolic resin may be used as the resin, and diazoquinone, PMMA (polymethyl methacrylate), and derivatives thereof may be used as the sensitizer. In the case of the negative photoresist, polyvinyl cinnamate, DCPA (2,3-dichloro-1-prophy-acrylate), and allylester prepolymer may be used the resin.

SiOCH, SiCHN, and SiCH may include an organic insulating material formed by a plasma chemical vapor deposition (CVD) method using a polyorganosilane. The polyorganosilane which may be used may include one or more selected from the group consisting of trimethylvinylsilane, triethylvinylsilane, dimethyldivinylsilane, diethyldivinylsilane, methyltrivinylsylane, ethyltrivinylsilane, tetravinylsilane, tetraethylsilane, and triethylsilane.

In addition, depending on the shape and position of the conductive protrusion 700, both or any one of the first insulation layer 410 and the second insulation layer 430 may not exist. Furthermore, a first signal TSV 640 may be formed in the first substrate 401, and may be coupled to a circuit layer (not illustrated) existing in the first substrate 401. The first signal TSV 640 may also be covered by an insulating layer 410.

Referring to FIG. 1, a plurality of conductive protrusions 700 may be positioned at a predetermined distance d from the central portion of the first test TSV 540 and arranged in a line. Furthermore, the conductive protrusions 700 may be arranged in two lines with a double distance set therebetween or in three or more lines. The conductive protrusions 700 may be positioned at an edge X of the semiconductor chip from the central portion of the first test TSV 540, but the present invention is not limited thereto.

Figure 3:
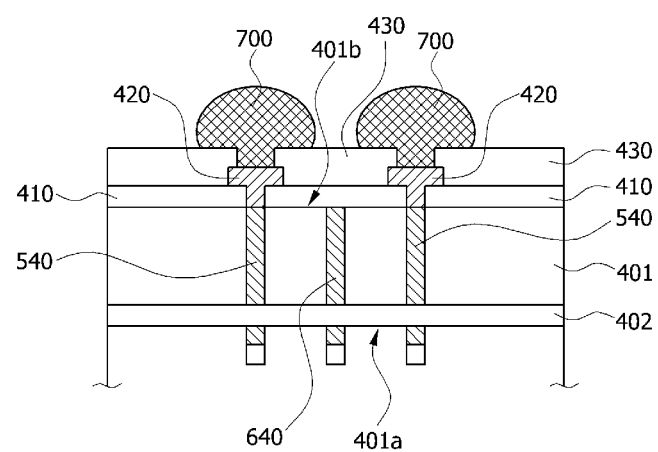
FIGS. 3 and 4 are cross-sectional views illustrating a partial structure of a semiconductor chip in accordance with an embodiment of the present invention.
Figure 4:
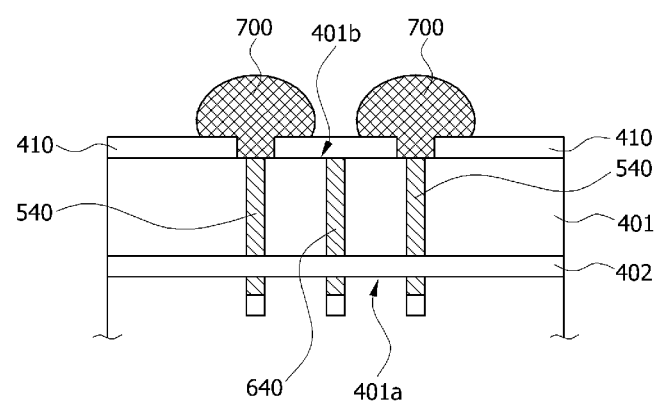

FIGS. 3 and 4 are cross-sectional views illustrating a partial structure of a semiconductor chip in accordance with an embodiment of the present invention.

Referring to FIG. 3, the conductive protrusion 700 in accordance with an embodiment of the present invention may be positioned in such a manner that the center thereof coincides with the first test TSV 540. Referring to FIG. 4, the conductive protrusion 700 may be directly connected to the first test TSV 540, and the land portion 420 and the second insulation layer 430 may be omitted.

Figure 5A:
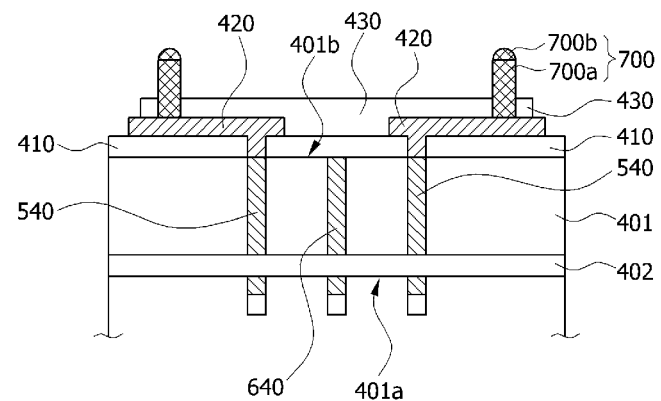
FIGS. 5A to 5C are cross-sectional views illustrating various examples of a conductive protrusion in accordance with an embodiment of the present invention.
Figure 5B:
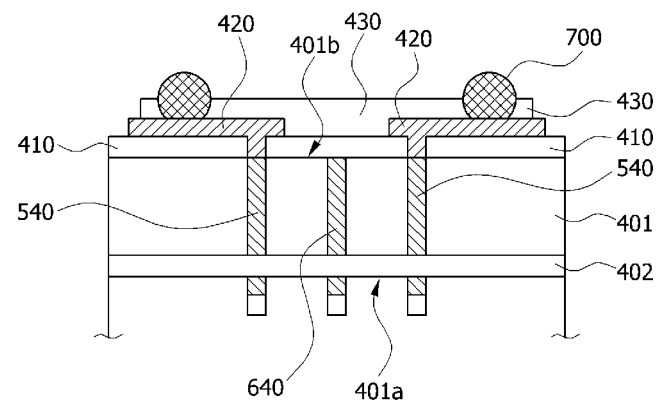
Figure 5C:
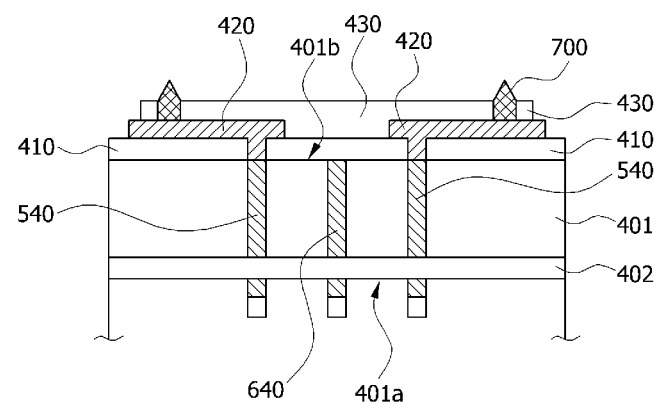

FIGS. 5A to 5C are cross-sectional views illustrating various examples of the conductive protrusion of the semiconductor chip in accordance with an embodiment of the present invention.

Referring to FIG. 5A, a conductive protrusion 700 may include a pillar portion 700a and a bump portion 700b. The pillar portion 700a and the bump portion 700b may be formed of the same material or different materials. Here, the pillar portion 700a may be formed of a metallic material, and the bump portion 700b may include a solder bump. For example, the pillar portion 700a may include one or more metals selected from the group consisting of Au, Ag, Cu, Al, Ni, W, Ti, Pt, Pd, Sn, Pb, Zn, In, Cd, Cr, and Mo, and may have a multilayer structure. The bump portion 700b may include a solder bump formed of Sn—Pb-based alloy solder, Sn—Pb—Ag-based alloy solder, or SAC (Sn—Ag—Cu)-based alloy solder. As the pillar portion 700a is formed in such a manner, it is possible to effectively deal with the reduction in size and weight of the semiconductor device (chip).

Also, the second insulation layer 430 may not exist, and the pillar portion 700a may be formed by a variety of methods including plating such as electroless plating or electroplating, ion plating, screen printing, spin coating, vacuum deposition, and sputtering. For example, photoresist is applied and patterned to expose a region where the pillar portion 700a is to be formed, and the pillar portion 700a formed of Cu and the bump portion 700b formed of solder are formed by electroplating. Then, the photoresist is removed, and the surface of the bump portion 700b is formed in a convex shape by a reflow process. In addition, a buffer layer for relieving a stress may be formed under the pillar portion 700a.

Referring to FIG. 5B, the conductive protrusion 700 may be formed in a spherical shape. Referring to FIG. 5C, the conductive protrusion 700 may have an upper portion of which the cross-section is formed in a triangle shape. In addition, the conductive protrusion 700 may be formed in various shapes.

Hereafter, referring to FIGS. 6A to 6G, a method for manufacturing a semiconductor chip in accordance with an embodiment of the present invention will be described. In the following descriptions, duplicated portions of the above descriptions will be omitted or simply described.

Figure 6A:
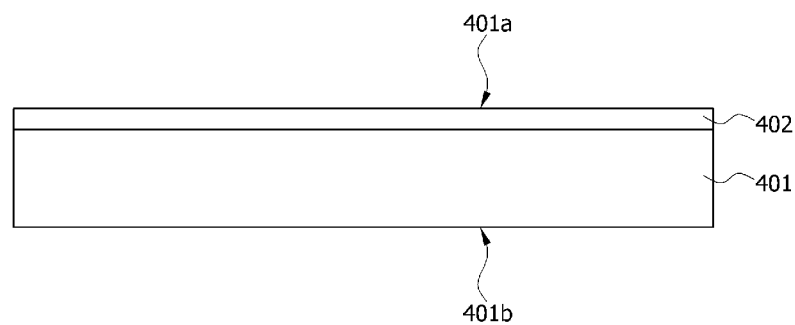
FIGS. 6A to 6G are cross-sectional views illustrating a method for manufacturing a semiconductor chip in accordance with an embodiment of the present invention.

Referring to FIG. 6A, a semiconductor substrate 401 having a first surface 401a and a second surface 401b facing away from the first surface 401a is prepared. Then, a semiconductor device such as a transistor is formed on the first surface 401a by a well-known semiconductor manufacturing technology. The region where the semiconductor device is formed is referred to as an active region 402. Strictly speaking, the semiconductor substrate 401 of FIG. 6A is not identical to the first substrate 401 obtained by sawing the semiconductor substrate 401. However, for convenience of description, the same reference numeral is used.

In the case of a memory device, the semiconductor substrate 401 may include a single crystal silicon substrate, but the present invention is not limited thereto. The semiconductor substrate 401 may include a substrate formed of GaAs, LiTaO$_3$, LiNbO$_3$, or sapphire as well as a polycrystalline silicon substrate. That is, different substrates may be used depending on which semiconductor device is to be formed.

Figure 6B:
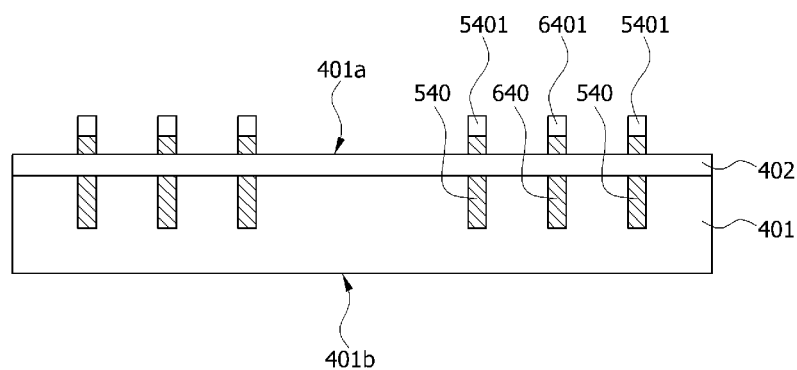

Referring to FIG. 6B, a first test TSV 540 and a first signal TSV 640 are formed. The first test TSV 540 and the first signal TSV 640 may be formed by a TSV formation technology. For example, a bonding pad (not illustrated) may be formed on the first surface 401a of the semiconductor substrate, and a trench is formed adjacent to the bonding pad. The trench may be formed by a laser drill or a deep reactive ion etching (RIE) method, and may include a vertical trench and a tapered trench. After the trench formation process, a chemical or physical treatment may be performed to remove residue occurring during the trench formation process and facilitate the following plating process, thereby improving plating adhesion. Then, a seed metal layer is formed, and the first test TSV 540 may be formed by burying a conductive material in the trench through electroplating. The first test TSV 540 and the first signal TSV 640 may have front bumps 5401 and 6401 formed at one ends thereof, respectively.

Figure 6C:
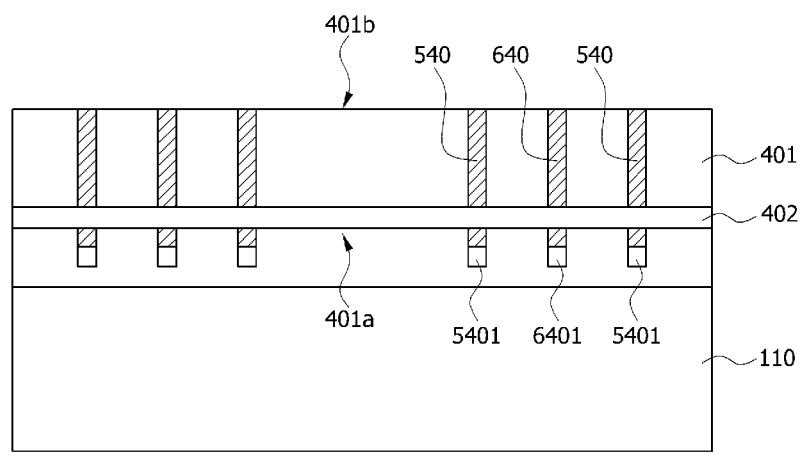

Referring to FIG. 6C, a carrier wafer 110 is bonded at the first surface 401a of the semiconductor substrate 401 having the TSVs 540 and 640 formed therein, and the second surface 401b of the semiconductor substrate 401 is ground to expose the TSVs 540 and 640. Here, the grinding may be performed in such a manner that the levels of the upper surfaces of the exposed TSVs are identical to the level of the second surface 401b of the semiconductor substrate 401. The carrier wafer 110 may be formed of glass or silicon. The carrier wafer 110 is temporally attached to easily handle the semiconductor substrate 401 which became thin by removing the upper portion (the other surface) of the semiconductor substrate 401 to a predetermined thickness. The carrier wafer 110 is attached through an adhesive layer formed of an adhesive agent which may be easily removed.

The grinding process to reduce the thickness of the semiconductor substrate 401 may be performed by a typical grinding apparatus for manufacturing a semiconductor device. For example, the grinding process may be performed by a grinding device including a loading area, a rough machining area, a finish machining area, and an unloading area. The rough machining is to roughly grind the second surface 401b of the loaded substrate, and the finish machining is to more smoothly grind the second surface 401b of the substrate.

Figure 6D:
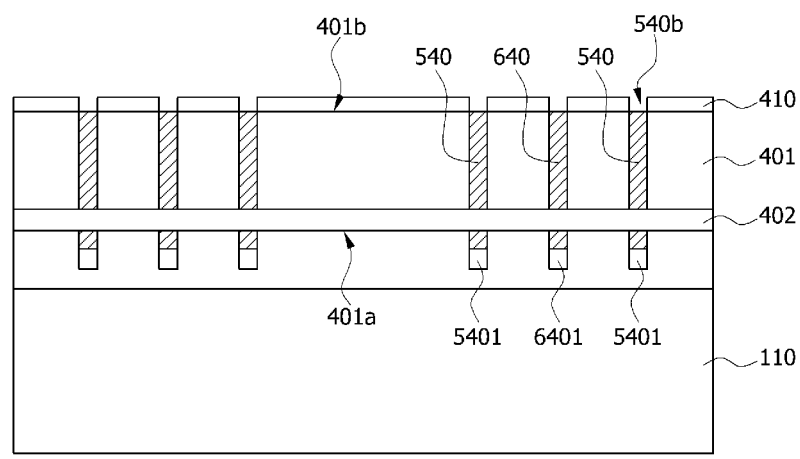

Referring to FIG. 6D, a first insulation layer 410 is formed over the ground second surface 401b of the semiconductor substrate, and then patterned to expose the upper portion 540b of the first test TSV 540. The first insulation layer 410 may be formed through a thin film formation process such as spin coating, sol-gel coating, deep coating, vacuum deposition, or chemical vapor deposition (CVD). For example, when the first insulation layer 410 includes silicon oxide, CVD or thermal oxidation may be used, and when the first insulation layer 410 includes photoresist, spin coating may be used.

The patterning method of the first insulation layer 410 may be selectively used depending on the type of insulation material. For example, when the insulation material is photoresist, an exposure and development method may be used. For another example, when the insulation material is silicon oxide (SiO$_2$), photoresist is applied onto the silicon oxide, and patterned through exposure and development, and the upper portion 540b of the first TSV 540 is exposed through a dry etching process using CF$_4$/H$_2$ gas or a wet etching process using buffered HF (BHF). Then, a known technology such as O$_2$ plasma ashing is used to remove remaining photoresist.

Figure 6E:
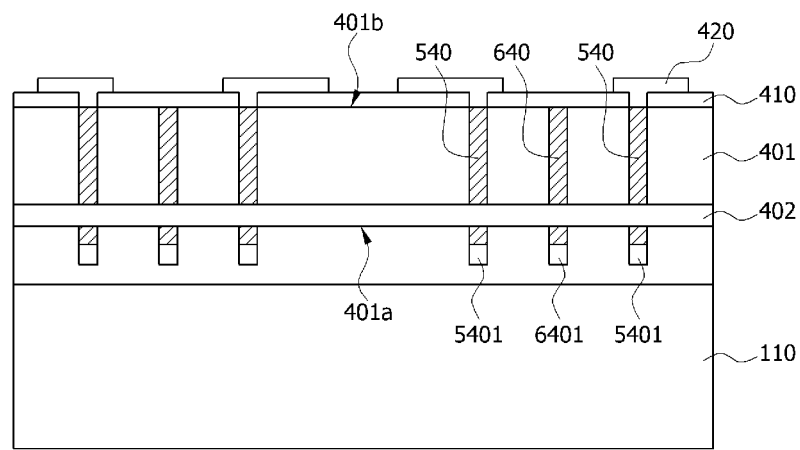

Referring to FIG. 6E, a land portion 420 is formed to be coupled to the test TSV 540 having the exposed upper surface. The land portion 420 may be formed by electroless plating, electroplating, vacuum deposition, or sputtering. For example, photoresist is applied, and a region where the land portion 420 is to be formed is exposed through exposure and development. Then, electroplating is used to form the land portion formed of a metallic material. For another example, a metallic material is first deposited, and photoresist is applied.

Then, a portion of the photoresist where the land portion 420 is to be formed is removed through a lithography process, and the deposited metallic material is patterned by an etching process such as dry etching or wet etching, using the remaining photoresist as an etch mask.

Figure 6F:
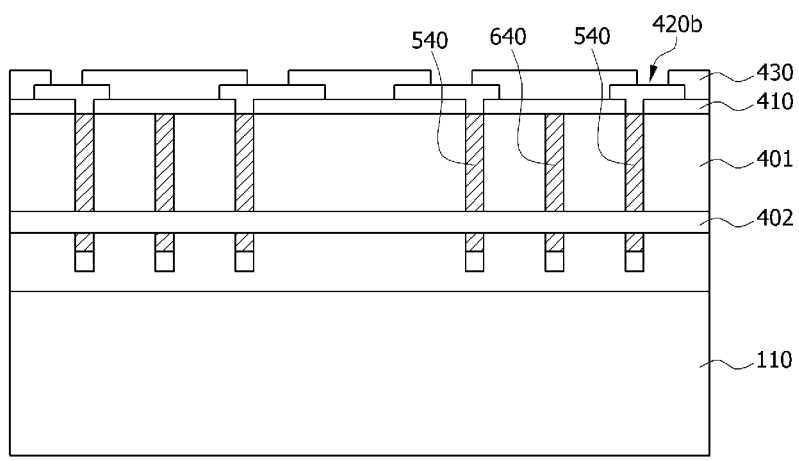

Referring to FIG. 6F, the second insulation layer 430 is formed and patterned to expose the region 420b where a conductive protrusion is to be landed. The second insulation layer 430 may include the same material as or a different material from the first insulation layer 410, and may be formed by the same manufacturing process or different manufacturing processes. The patterning of the second insulation layer 430 may be performed according to the above-described patterning process of the first insulation layer 410.

Figure 6G:
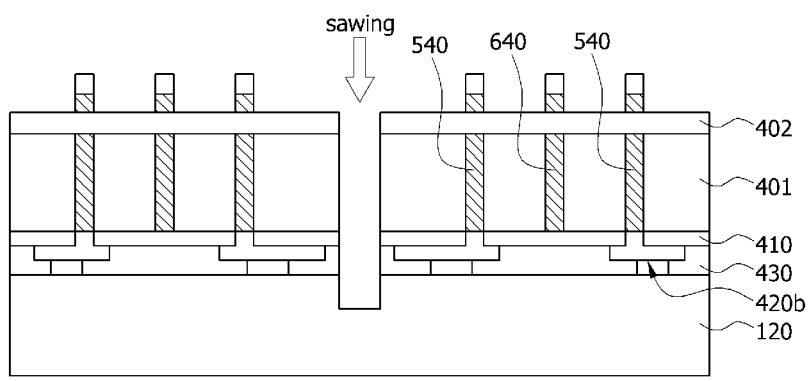

Referring to FIG. 6G, the carrier wafer 110 attached to the semiconductor substrate 401 is de-bonded, a saw tape 120 is attached, and the substrate 400 is sawed into individual semiconductor chips. The sawing of the substrate 400 may be performed by diamond sawing or laser sawing.

Hereafter, a stack-type semiconductor package in accordance with an embodiment of the present invention will be described. The stack-type semiconductor package in accordance with an embodiment of the present invention may include a stacked structure of one or more semiconductor chips. The following descriptions will be focused on a stacked structure of three semiconductor chips (or interposers), for example.

Figure 7A:
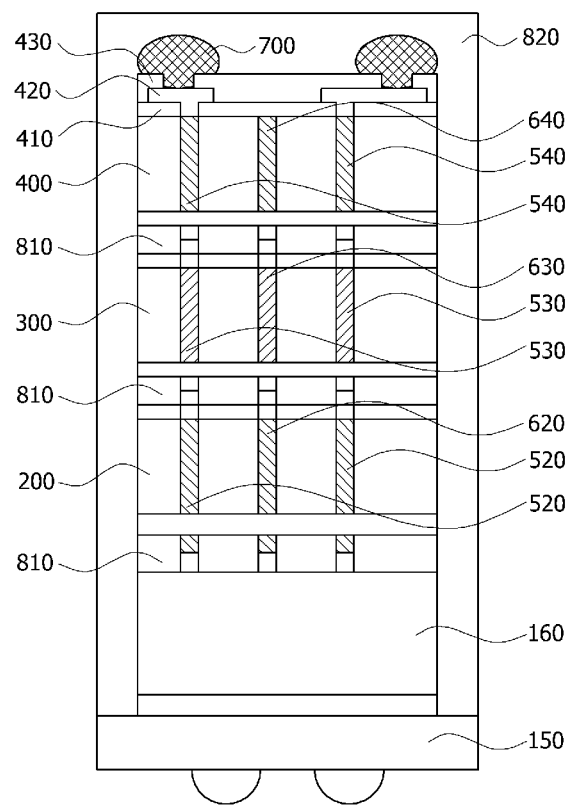
FIGS. 7A and 7B are cross-sectional views illustrating a partial construction of a stack-type semiconductor package in accordance with an embodiment of the present invention.
Figure 7B:
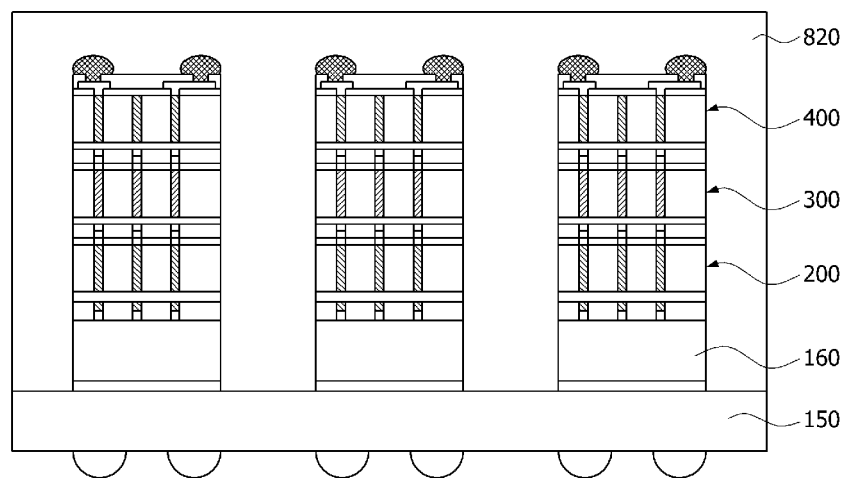

FIGS. 7A and 7B are cross-sectional views illustrating a partial construction of the stack-type semiconductor package in accordance with an embodiment of the present invention.

Referring to FIG. 7A, the semiconductor package in accordance with an embodiment of the present invention includes a plurality of semiconductor chips 200, 300, and 400 stacked over a substrate 150. The substrate 150 may include a printed circuit board (PCB) or a package substrate coupling a PCB and semiconductor chips in the middle thereof. A controller 160 may be interposed between the substrate 150 and the semiconductor chip 200. The controller 160 may include a control chip having logic circuits such as a SER/DES circuit. For example, the first and second semiconductor chips 200 and 300 may include a memory chip such as FRAM or DRAM. Furthermore, the same kind of semiconductor chip or different kinds of semiconductor chips may be used as the first and second semiconductor chips 200 and 300.

The semiconductor chips 200, 300, and 400 include test TSVs 520, 530, and 540 and signal TSVs 620, 630, and 640, respectively. The test TSVs and the signal TSVs of the respective semiconductor chips are aligned at positions corresponding to each other and coupled to each other. Spaces between the respective semiconductor chips 200, 300, and 400 are filled with a gap-fill material 810, and the stacked semiconductor chips are finally molded with a molding material 820 such as an epoxy molding compound (EMC).

The semiconductor chip 400 arranged at the uppermost part among the semiconductor chips stacked in the package includes a conductive protrusion 700 which is coupled to the test TSV 540 and is provided for a test. Since the shape or material of the conductive protrusion 700 has been already described above, the detailed descriptions thereof are omitted herein. Furthermore, the detailed descriptions of the same components as those of the structure described in the semiconductor chip in accordance with an embodiment of the present invention are also omitted.

FIG. 7B illustrates an example of a semiconductor package in which one or more stack-type packages of FIG. 7A are horizontally mounted. Except that the stack-type packages are horizontally mounted, the semiconductor package has the same structure as illustrated in FIG. 7A. Therefore, the detailed descriptions thereof are omitted.

Referring to FIGS. 8A to 8E, a method for manufacturing the stack-type semiconductor package in accordance with an embodiment of the present invention will be described.

Figure 8A:
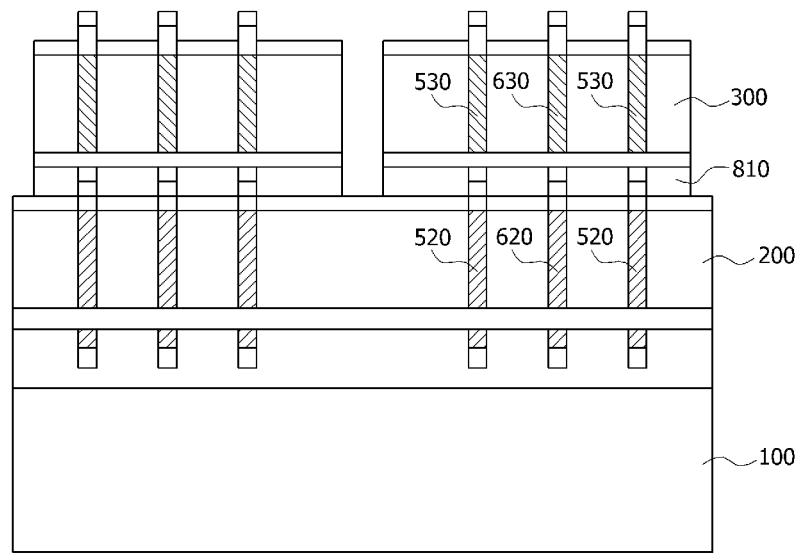
FIGS. 8A to 8E are cross-sectional views illustrating a method for manufacturing a semiconductor package in accordance with an embodiment of the present invention.

First, referring to FIG. 8A, an interposer (or third semiconductor chip) 200 having a third TSV 520 formed therein is arranged over a carrier wafer 100, and a second semiconductor chip 300 having a second test TSV 530 formed therein is arranged over the interposer 200. Here, the interposer 200 and the second semiconductor chip 300 may include a third signal TSV 620 and a second signal TSV 630 formed therein, respectively. Also, the third signal TSV 620 and the second signal TSV 630 are aligned at positions corresponding to each other, and the second test TSV 530 and the third test TSV 520 are also aligned at positions corresponding to each other so as to be coupled to each other. A space between the interposer 200 and the second semiconductor chip 300 may be filled with a gap-fill material 810.

Figure 8B:
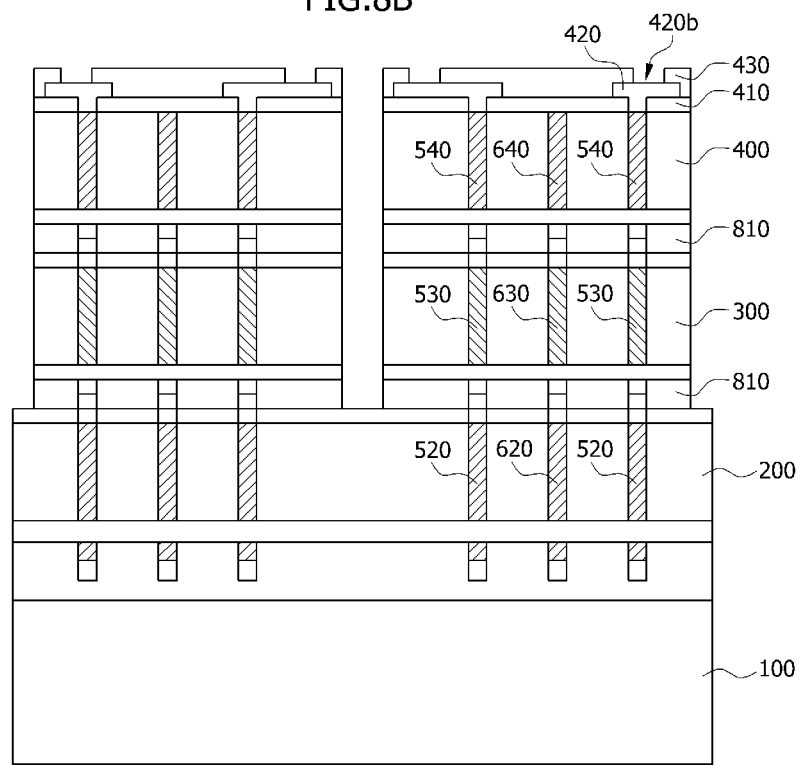

Referring to FIG. 8B, the first semiconductor chip 400 manufactured through the processes of FIGS. 6A to 6G is arranged over the second semiconductor chip 300. At this time, the first test TSV 540 and the second test TSV 530 are aligned at positions corresponding to each other, and the first signal TSV 640 and the second signal TSV 630 are aligned at positions corresponding to each other so as to be coupled to each other. A space between the first semiconductor chip 400 and the second semiconductor chip 300 may be filled with the gap-fill material 810.

The first and second test TSVs 540 and 530 and the first and second signal TSVs 640 and 630, respectively, may be coupled to each other through solder paste, a solder bump, or a conductive adhesive, which is interposed therebetween and is not illustrated.

Figure 8C:
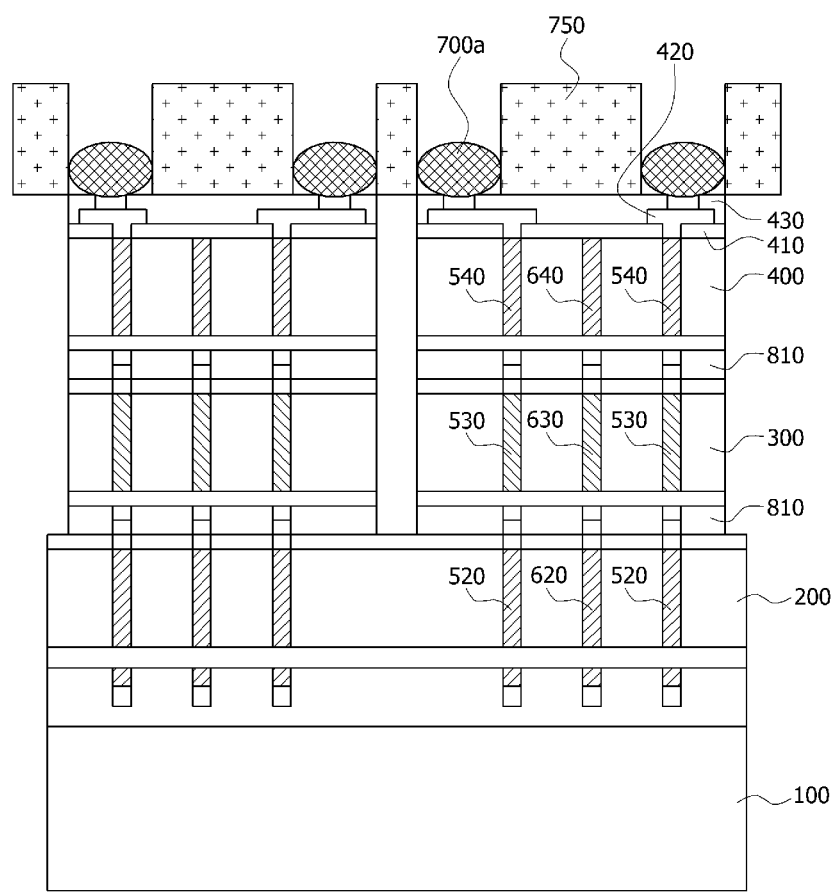

Referring to FIG. 8C, a solder ball is mounted in an open portion of a mask 750, that is, a conductive protrusion landing region in a state in which the mask 750 is disposed over the first semiconductor chip 400. When the mask is used, a photoresist or etching process may be excluded. The mask 750 may include a metal mask and may be formed of SUS304 or the like, but the present invention is not limited thereto. Furthermore, solder paste may be applied, instead of mounting the solder ball.

Figure 8D:
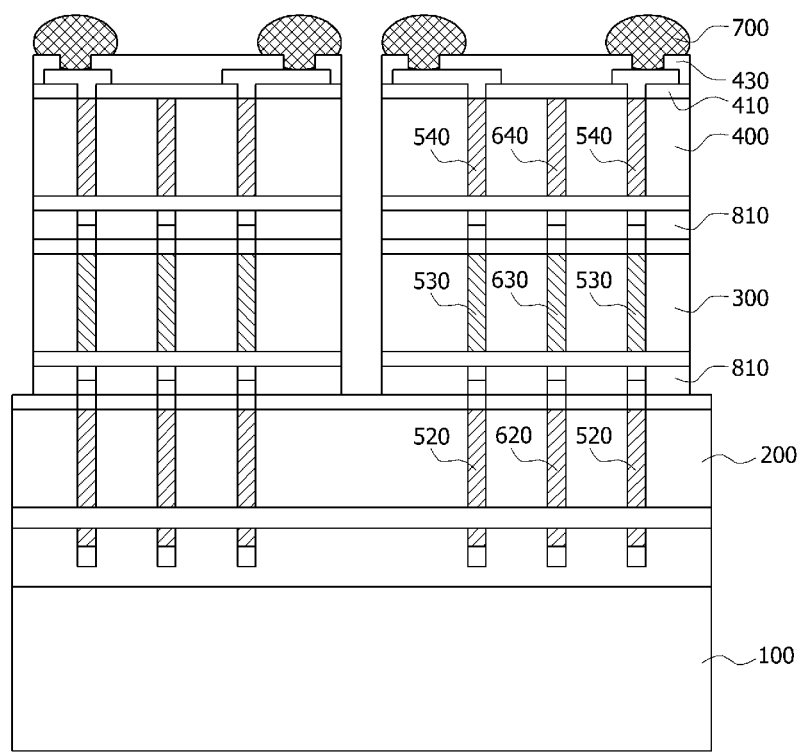

Referring to FIG. 8D, the mask 750 is removed, and a conductive protrusion 700 is formed by a reflow process. The temperature of the reflow process may differ depending on the composition of the used solder ball, and may be raised to the fusing point of the used solder ball or more. For example, an eutectic Pb—Sn alloy (63Sn/37Pb) used as general solder has a fusing point of 183° C. Therefore, the temperature of the reflow process may be raised to 183° C. or more or a temperature which is higher by 5 to 30° C. than the fusing point, in order to secure an excellent solder flow and a perfect fusing quality.

FIGS. 8C and 8D illustrate a process of forming the conductive protrusion through the solder ball mounting and the reflow process, and the present invention is not limited thereto. That is, a conductive material is applied (deposited), photoresist is applied, exposure and development are performed through a lithography process such as photolithography, E-beam lithography, X-ray lithography, or extreme UV lithography, and etching is performed to form a desired pattern (conductive protrusion). Furthermore, conductive paste may be applied through a screen printing process, and a dry or baking process may be then performed to form a conductive protrusion. As described above, the conductive protrusion may include a conductive protrusion having a pillar portion and a bump portion. Any manufacturing methods may be used, and the upper portion of the conductive protrusion may be formed in such a convex shape as to facilitate a package test.

Figure 8E:
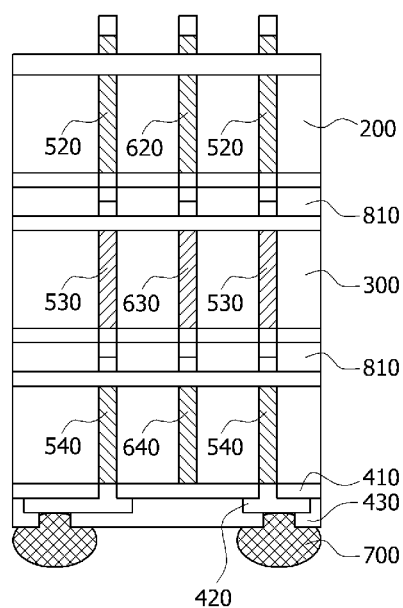

Referring to FIG. 8E, the carrier wafer 100 is de-bonded, and the package is completed through a sawing process. If necessary, an additional process may be performed. By forming the package described above, a test may be performed for each single package through the conductive protrusion 700.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A semiconductor chip comprising:
   a first substrate having a first surface and a second surface facing away from the first surface;
   a signal through silicon via(TSV) passing through the first substrate from the first surface to the second surface;
   a first test through silicon via(TSV) passing through the first substrate from the first surface to the second surface, wherein the first test TSV is disposed apart from the signal TSV;
   an insulation layer disposed above the second surface of the first substrate, wherein the insulation layer covers the signal TSV and has a via hole opening the first test TSV; and
   a conductive protrusion coupled to the test TSV through the via hole and protruding from the second surface.

2. The semiconductor chip of claim 1, wherein the conductive protrusion comprises one or more metals selected from the group consisting of gold (Au), silver (Ag), copper (Cu), aluminum (Al), nickel (Ni), tungsten (W), titanium (Ti), platinum (Pt), palladium (Pd), tin (Sn), plumbum (Pb), zinc (Zn), indium (In), cadmium (Cd), chrome (Cr), and molybdenum (Mo).

3. The semiconductor chip of claim 1, wherein the conductive protrusion is positioned at an edge of the substrate, which deviates from the center of the first test TSV.

4. The semiconductor chip of claim 1, further comprising a land portion coupling the conductive protrusion and the first test TSV.

5. The semiconductor chip of claim 4, wherein the land portion is coupled to the first test TSV through a rearrangement interconnection.

6. The semiconductor chip of claim 4, wherein the land portion comprises one or more metals selected from the group consisting of Au, Ag, Cu, Al, Ni, W, Ti, Pt, Pd, Sn, Pb, Zn, In, Cd, Cr, and Mo.

7. A semiconductor package comprising:
   a substrate;
   two or more semiconductor chips stacked over the substrate, wherein each of the semiconductor chips has a first surface and a second surface facing away from the first surface and comprises a signal TSV and a test TSV passing through the semiconductor chip from the first surface to the second surface;
   an insulation layer disposed above the second surface of the first substrate, wherein the insulation layer covers the signal TSV and has a via hole opening the first test TSV; and
   a conductive protrusion protruding from the second surface of the only uppermost semiconductor chip among the semiconductor chips and coupled to the test TSV through the via hole.

8. The semiconductor package of claim 7, wherein the conductive protrusion comprises one or more metals selected from the group consisting of Au, Ag, Cu, Al, Ni, W, Ti, Pt, Pd, Sn, Pb, Zn, In, Cd, Cr, and Mo.

9. The semiconductor package of claim 7, wherein the conductive protrusion is positioned at an edge of the substrate, which deviates from the center of the test TSV.

10. The semiconductor package of claim 7, further comprising a land portion formed on the second surface of the uppermost semiconductor chip and coupling the conductive protrusion and the test TSV.

11. The semiconductor package of claim 10, wherein the land portion is coupled to the test TSV through a rearrangement interconnection.

12. The semiconductor package of claim 11, wherein the land portion comprises one or more metals selected from the group consisting of Au, Ag, Cu, Al, Ni, W, Ti, Pt, Pd, Sn, Pb, Zn, In, Cd, Cr, and Mo.

13. The semiconductor package of claim 7, further comprising a controller between the substrate and the semiconductor chip.

14. A semiconductor chip comprising:
   a first substrate having a first surface and a second surface facing away from the first surface;
   a signal through silicon via(TSV) passing through the first substrate from the first surface to the second surface;
   a test through silicon via(TSV) passing through the first substrate from the first surface to the second surface, wherein the test TSV dispose apart from the signal TSV;
   an insulation layer disposed the second surface of the first substrate, wherein the insulation layer cover the signal TSV and have a via hole opening the test TSV; and
   a land portion coupled to the first test TSV through the via hole.

* * * * *